(12) United States Patent
Shannon et al.

(10) Patent No.: US 7,879,185 B2
(45) Date of Patent: Feb. 1, 2011

(54) DUAL FREQUENCY RF MATCH

(75) Inventors: Steven C. Shannon, San Mateo, CA (US); John Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 813 days.

(21) Appl. No.: 10/823,371

(22) Filed: Apr. 12, 2004

(65) Prior Publication Data

US 2005/0133163 A1 Jun. 23, 2005

Related U.S. Application Data

(60) Provisional application No. 60/530,807, filed on Dec. 18, 2003.

(51) Int. Cl.
*C23F 1/00* (2006.01)
*H01L 21/306* (2006.01)
*C23C 16/00* (2006.01)

(52) U.S. Cl. .............. 156/345.44; 118/723 E

(58) Field of Classification Search ............ 156/345.43, 156/345.44, 345.47; 118/722, 723 R, 723 E
See application file for complete search history.

(56) References Cited

U.S. PATENT DOCUMENTS

| | | | |
|---|---|---|---|
| 4,579,618 A | 4/1986 | Celestino et al. | |
| 4,585,516 A | 4/1986 | Corn et al. | |
| 5,273,610 A | 12/1993 | Thomas et al. | |
| 5,383,019 A | 1/1995 | Farrell et al. | |
| 5,472,564 A | 12/1995 | Nakamura et al. | |
| 5,512,130 A | 4/1996 | Barna et al. | |
| 5,556,501 A | 9/1996 | Collins et al. | |
| 5,689,215 A | 11/1997 | Richardson et al. | |
| 5,889,252 A | 3/1999 | Williams et al. | |
| 6,089,181 A | 7/2000 | Suemasa et al. | |
| 6,252,354 B1 | 6/2001 | Collins et al. | |
| 6,259,334 B1 | 7/2001 | Howald | |
| 6,354,240 B1 | 3/2002 | DeOrnellas et al. | |
| 6,642,149 B2 * | 11/2003 | Suemasa et al. | 438/710 |
| 6,887,339 B1 * | 5/2005 | Goodman et al. | 156/345.28 |
| 2002/0041160 A1 | 4/2002 | Barnes et al. | |
| 2002/0046989 A1 | 4/2002 | Blonigan et al. | |
| 2003/0054647 A1 | 3/2003 | Suemasa et al. | |

FOREIGN PATENT DOCUMENTS

| | | |
|---|---|---|
| EP | 0553704 | 8/1992 |
| EP | 0840350 | 5/1998 |

(Continued)

OTHER PUBLICATIONS

English Machine Translation of JP 06-243992 A to Deguchi et al. Obtained from http://www19.ipdl.ncipi.go.jp/PA1/cgi-bin/PA1INDEX on Oct. 25, 2006.*

(Continued)

*Primary Examiner*—Maureen Gramaglia
(74) *Attorney, Agent, or Firm*—Moser IP Law Group

(57) ABSTRACT

A dual frequency matching circuit for plasma enhanced semiconductor processing chambers having dual frequency cathodes is provided. The matching circuit includes two matching circuits with variable shunts combined to a common output. The matching circuit balances the load of the independent RF sources to that of the plasma in the processing chamber during operation.

19 Claims, 5 Drawing Sheets

FOREIGN PATENT DOCUMENTS

| | | | |
|---|---|---|---|
| EP | 1 215 710 | | 8/2002 |
| JP | 06243992 A | * | 9/1994 |
| JP | 08097199 A | * | 4/1996 |
| JP | 2003-073836 | | 3/2003 |
| WO | WO 03/043061 | | 5/2003 |

OTHER PUBLICATIONS

English Machine Translation of JP 08097199A. Obtained from http://www.ipdlinpit.go.jp/homepg_e.ipdl on May 11, 2007.*

Official English Translation of JP 06-243992A to Deguchi et al.*

Official English Translation of JP 08-097199 to Nishiyama et al.*

PCT International Search Report, Written Opinion, PCT/US2004/039081/Applied Materials, Inc., Aug. 3, 2005.

J. Staples, et al.: "High-Efficiency Matching Network for RF-Driven Ion Sources". Proceedings of the 2001 Particle Accelerator Conference (PAC 2001),Chicago, Jun. 18-22, 2001; Particle Accelerator Conference, New York: IEEE, US, vol. 1, Jun. 18, 2001, pp. 2108-2110.

* cited by examiner

DUAL FREQUENCY RF MATCH

CROSS-REFERENCE TO RELATED APPLICATIONS

This application claims the benefit of U.S. Provisional Application No. 60/530,807 filed Dec. 18, 2003, which is hereby incorporated by reference in its entirety.

BACKGROUND OF THE INVENTION

1. Field of the Invention

The present invention generally relates to semiconductor substrate processing systems and, more particularly, to matching circuits for matching the impedance of a plurality of RF sources coupled to a single electrode to the impedance of a plasma.

2. Description of the Related Art

Plasma enhanced semiconductor processing chambers are widely used in the manufacture of integrated devices. In most plasma enhanced semiconductor chambers, multiple radio frequency (RF) generators are utilized to form and control the plasma. Some plasma enhanced processing chambers feed RF power from multiple sources to a single electrode that couples the power to the plasma. However, in those embodiments, each RF source generally requires separate feed structures (e.g., separate RF generator, match output, coaxial cables to the electrode, and the like).

Therefore, there is a need for an improved apparatus for semiconductor substrate processing that utilizes a single feed structure to couple RF power from multiple RF sources to an electrode.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention generally relates to semiconductor substrate processing in a plasma enhanced semiconductor processing chamber. More specifically, the present invention is a dual frequency, variable shunt matching circuit for coupling two RF sources through a single feed to an electrode in a plasma enhanced semiconductor processing chamber.

Figure 1:
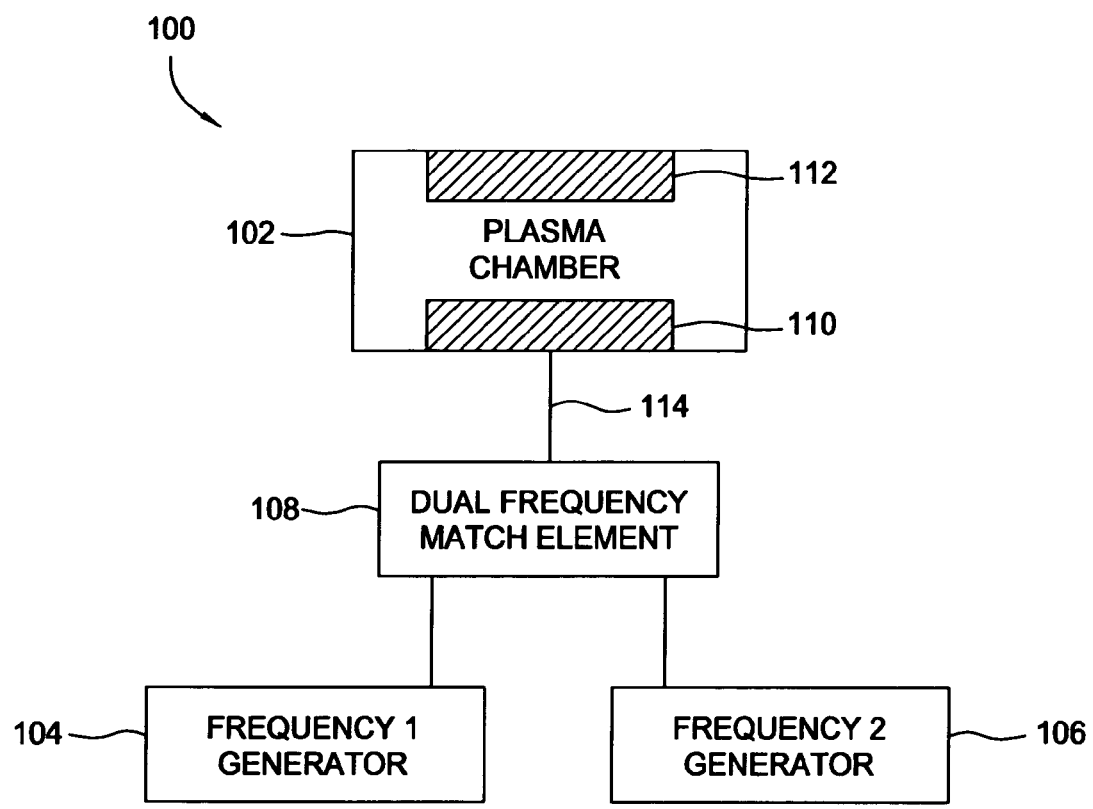
FIG. 1 depicts an exemplary block diagram of the RF structure of the present invention.

FIG. 1 depicts a simplified block diagram of a plasma enhanced semiconductor processing chamber having a dual frequency, variable shunt matching circuit. A plasma enhanced processing chamber 100 according to the present invention includes a chamber 102, two RF power sources 104, 106 and a dual frequency matching circuit 108. The chamber 102 includes a powered electrode 110 and a grounded electrode 112. A single feed line 114 from the dual frequency matching circuit 108 electrically couples the sources 104, 106 to the powered electrode 110. The chamber 102 is otherwise similar to a conventional plasma enhanced processing chamber.

The RF sources 104, 106 are independent, frequency-tuned RF generators. The RF sources 104, 106 may be configured to provide RF power to the chamber 102 in any desired frequency to control characteristics of the plasma. Both frequencies may be selected to control the same plasma characteristic or, alternatively, to control different plasma characteristics. For example, in one embodiment, one of the RF sources 104, 106 is capable of providing high frequency power to excite the plasma and dissociate ions in the plasma and the other one of the RF sources 104, 106 is capable of providing low frequency power to modulate the plasma sheath voltage. For example, in one embodiment, the source 104 may be generally capable of generating a frequency in the range of from about 12.8 MHz to about 14.3 MHz at up to 5000 W of either continuous or pulsed power. The source 106 may be generally capable of generating a frequency in the range of from about 1.8 MHz to about 2.2 MHz at up to 5000 W of either continuous or pulsed power. It is contemplated that other frequencies may be employed.

The dual frequency matching circuit 108 generally includes two matching sub-circuits in which the series elements are fixed and in which the shunt elements provide a variable impedance to ground. The matching circuit 108 includes two inputs that are connected to independent frequency tuned RF power sources 104, 106 at two separate frequencies and provides a common RF output to the processing chamber 102. The matching circuit 108 operates to match the impedance of the sources 104, 106 (typically 50 Ω) to that of the processing chamber 102. In one embodiment, the two match sub-circuits are L-type circuits, however, other common match circuit configurations, such as π and T types can be employed.

Figure 2:
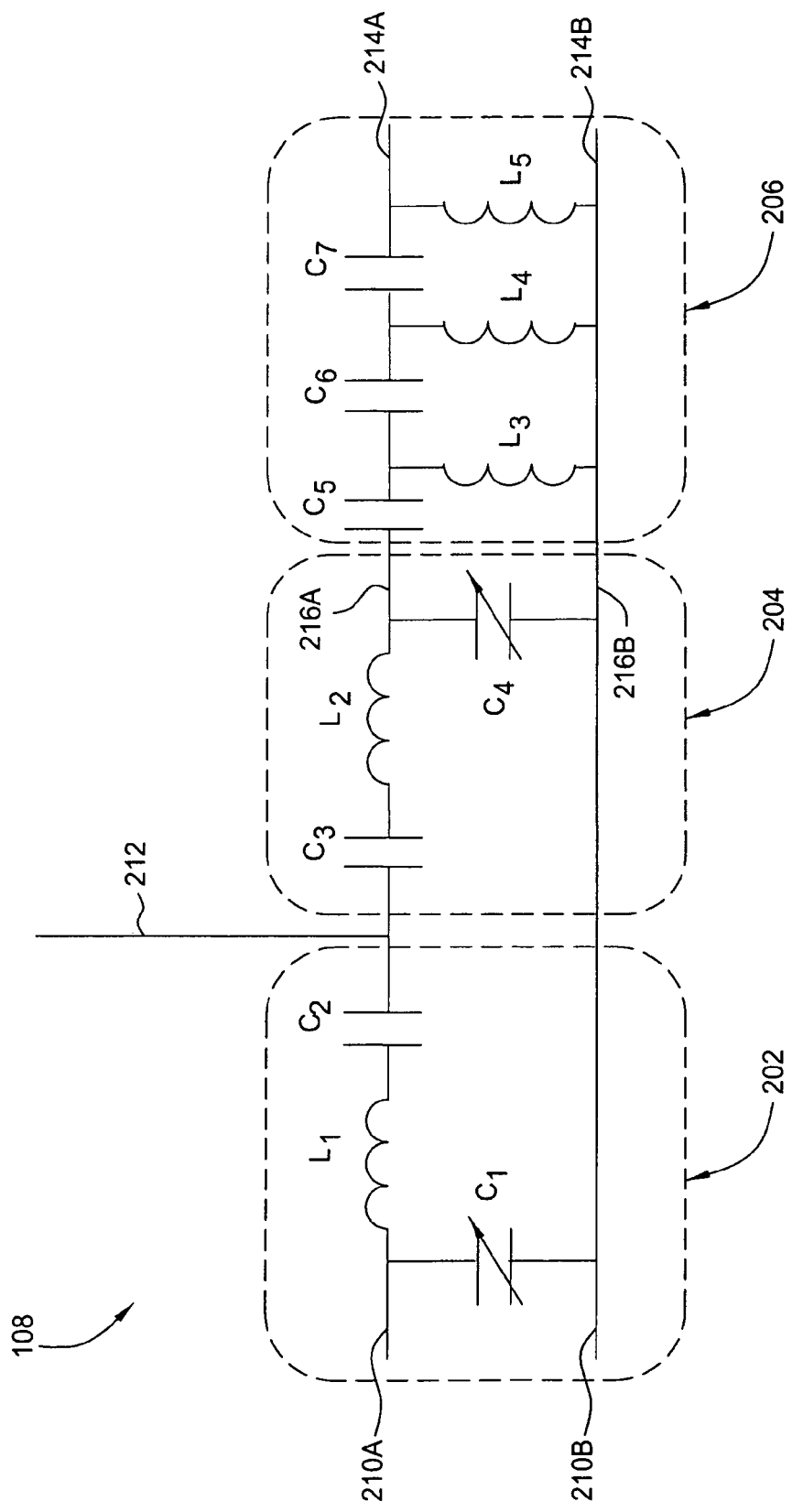
FIG. 2 is a schematic diagram of one embodiment of the matching circuit of the present invention.

FIG. 2 is a representative circuit diagram of one embodiment of a dual frequency matching circuit 108 having dual L-type match topography. The matching circuit 108 generally includes a low frequency (first) tuning sub-circuit 202, a high frequency (second) tuning sub-circuit 204, and a generator isolation sub-circuit 206. First sub-circuit 202 comprises variable capacitor $C_1$, inductor $L_1$ and capacitor $C_2$. The variable capacitor $C_1$ is shunted across the input terminals 210A, 210B from the 2 MHz source and the inductor $L_1$ and capacitor $C_2$ are connected in series from the input terminals 210A and 210B to the common output terminal 212. In one embodiment, variable capacitor $C_1$ is nominally variable from about 300 pF to about 1500 pF, inductor $L_1$ is about 30 μH, and capacitor $C_2$ is about 300 pF.

The generator isolation sub-circuit 206 comprises a ladder topology having three inductors $L_3$, $L_4$ and $L_5$ and three capacitors $C_5$, $C_6$ and $C_7$. This sub-circuit is tuned to block the 2 MHz signal from being coupled to the 13 MHz source. Inductor $L_5$ is coupled across input terminals 214A, 214B.

The capacitors $C_7$, $C_6$ and $C_5$ are coupled in series from the input terminal 214A to an input 216A to the 13 MHz tuning circuit 204. The inductors $L_4$ and $L_3$ are respectively coupled in parallel from the junction of capacitors $C_7$ and $C_6$ and capacitors $C_6$ and $C_5$. In one embodiment, the inductors $L_4$ and $L_5$ are about 2 µH and inductor $L_3$ is about 1 µH. The capacitors $C_6$ and $C_7$ are about 400 pF and capacitor $L_5$ is about 800 pF.

Second sub-circuit 204 comprises capacitor $C_3$, inductor $L_2$ and variable capacitor $C_4$. The variable capacitor $C_4$ is shunted across input terminals 216A, 216B from the generator isolation sub-circuit 206 and the inductor $L_2$ and capacitor $C_3$ are connected in series from the input terminals 216A and 216B to the common output terminal 212. In one embodiment, variable capacitor $C_4$ is nominally variable from about 400 pF to about 1200 pF, inductor $L_2$ is about 2.4 µH, and capacitor $C_3$ is about 67 pF.

Figure 3B:
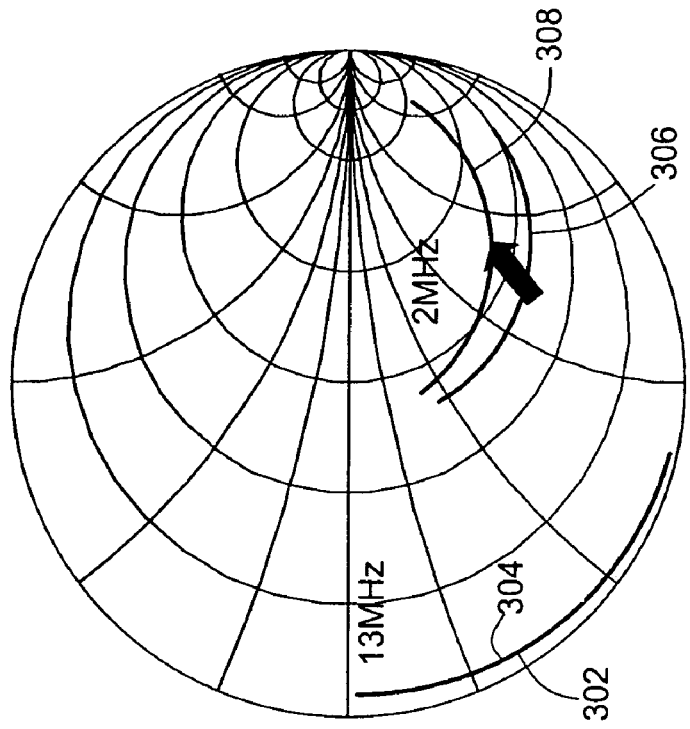
FIG. 3B is a graph depicting the tune space shifting due to series component variation of complimentary frequency elements.
Figure 3A:
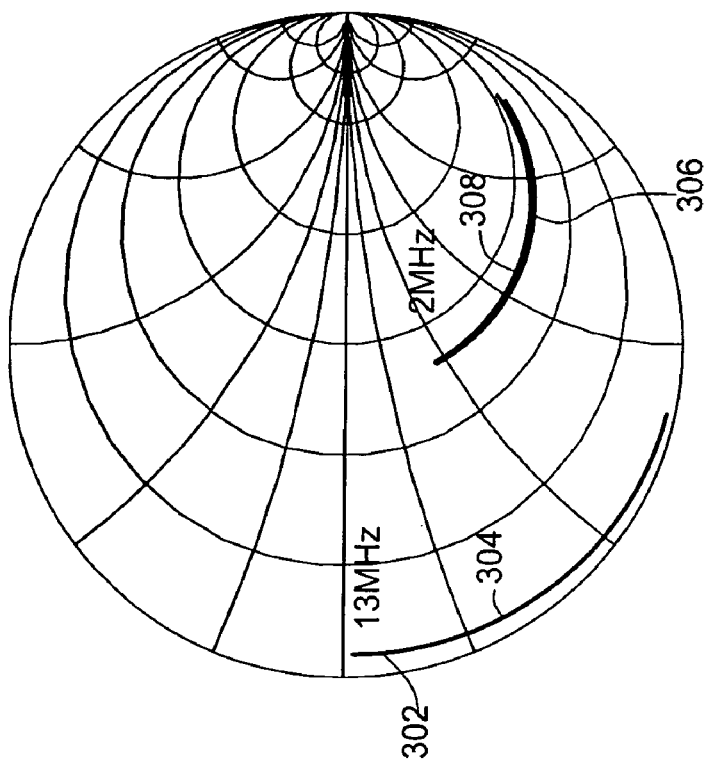
FIG. 3A is a graph depicting the tune space shifting due to shunt variation of complimentary frequency elements.

Typically, in the current state of the art technology for impedance matching, either the series and shunt elements are varied, or the elements are fixed and the source frequency is varied to achieve an impedance match between a source and the load (e.g., the plasma). Where the series and shunt elements are varied, the elements responsible for matching one of the source frequencies can impact the load impedance seen by the elements responsible for matching the other source frequency. For example, FIGS. 3A and 3B show how the tune space for 2 MHz and 13 MHz shifts when the other frequency's match elements are varied. In FIG. 3A, the shunt components (e.g., capacitors $C_1$ and $C_4$ in FIG. 2) are shown to have little or no effect on the other frequency's tune space (as depicted by overlaying lines 302 and 304, and 306 and 308). However, when the series component corresponding to one frequency source (e.g., inductor $L_1$ and capacitor $C_2$ or inductor $L_2$ and capacitor $C_3$ in FIG. 2) is varied, the tune space for the other frequency shifts. FIG. 3B depicts the effect of varying the series component at 13 MHz. When the 13 MHz series component is varied, the 2 MHz tune space shifts. This is shown by the shift in lines 306 and 308, which no longer overlap.

The design of the present invention, however, as discussed above with reference to FIGS. 1 and 2, results in a match tune space that can be varied by shunt component tuning without the undesirable side-effect on the other frequency's tune space. Consequently, the complimentary frequency tune space remains unaffected, and a zero reflected power tune space can be realized over a large impedance range.

Figure 4:
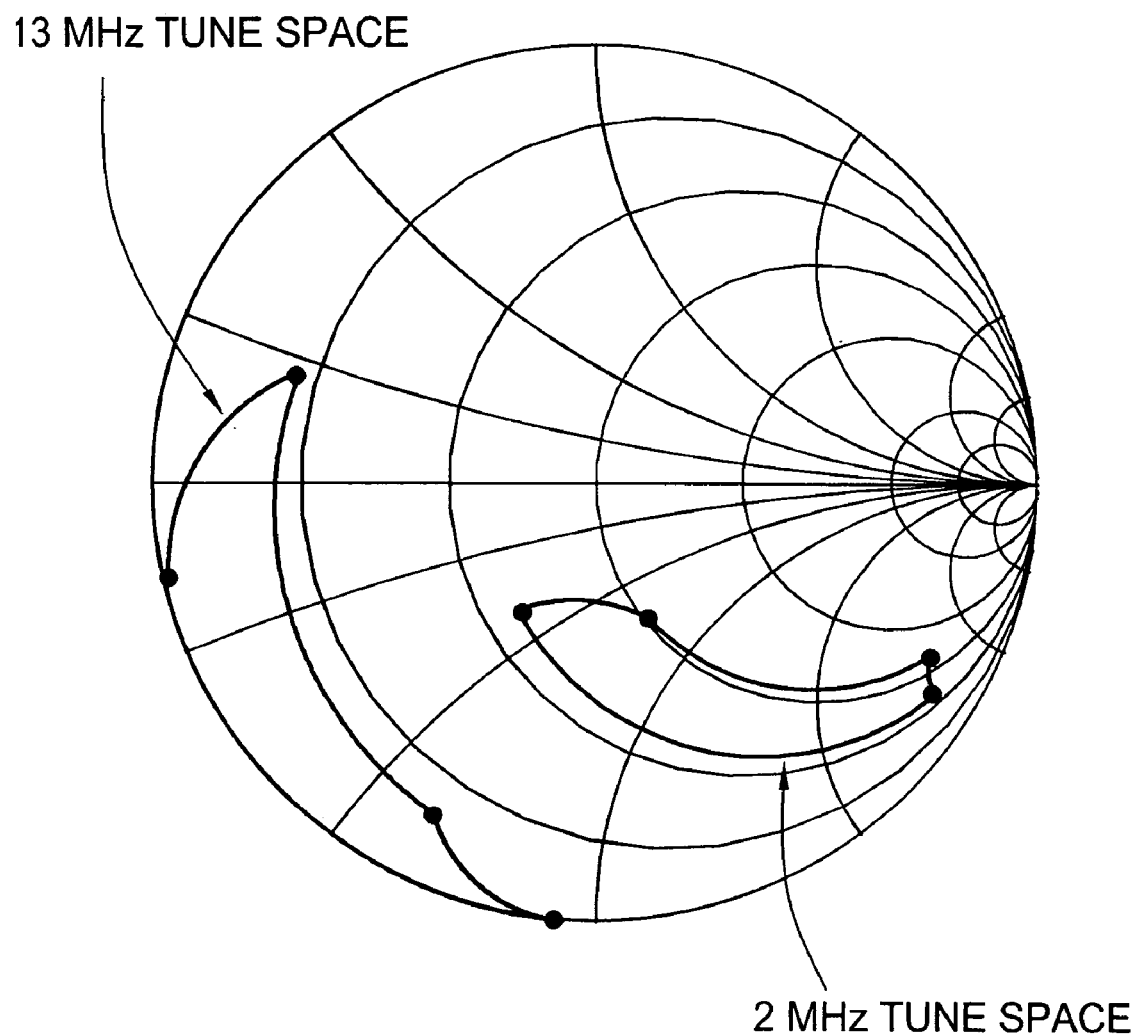
FIG. 4 is a graph of the tune space of the variable shunt matching circuit of the present invention.

For example, FIG. 4 depicts a plot of the tune space seen using the matching circuit 108 of FIG. 2. This configuration can be contained in either a fixed match condition, where the component values are set prior to a process run and the values are fixed for the entire run, or the circuit 108 can be implemented in a frequency/shunt autotune match configuration, where the frequency of the generator is tuned to establish the azimuthal tuning direction of the matching circuit and the variable shunts (capacitors $C_2$ and $C_4$) will set the radial tuning direction. These two tuning mechanisms (frequency tuning and shunt tuning) operate in perpendicular directions in the tune space and can independently tune to the optimal condition given the appropriate time response for an autotuning algorithm. As such, this form of tuning prevents unstable feedback between the two systems that may cause an untunable condition.

Examples of plasma enhanced semiconductor processing chambers that may be adapted to benefit from the present invention include, but are not limited to, the eMax™, MXP®, and ENABLER™ processing chambers, all available from Applied Materials, Inc. of Santa Clara, Calif. The eMax™ processing chamber is described in U.S. Pat. No. 6,113,731, issued Sep. 5, 2000 to Shan et al. The MXP® processing chamber is described in U.S. Pat. No. 5,534,108, issued Jul. 9, 1669 to Qian et al., and U.S. Pat. No. 5,674,321, issued Oct. 7, 1997 to Pu et al. The ENABLER™ processing chamber is described in U.S. Pat. No. 6,528,751, issued Mar. 4, 2003 to Hoffman et al. Each of these above-mentioned patents are hereby incorporated by reference in their entireties.

Figure 5:
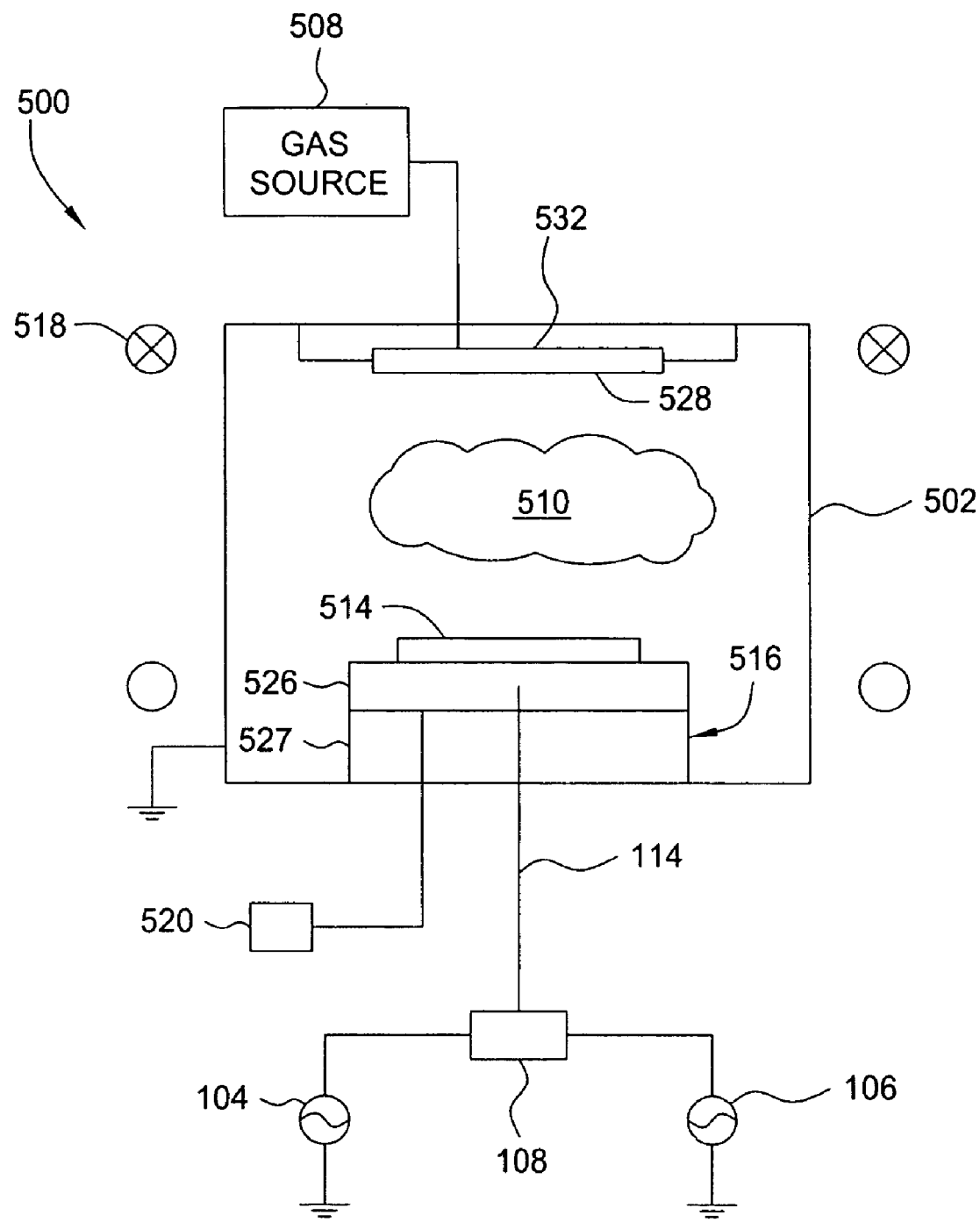
FIG. 5 is an illustrative schematic diagram of a plasma enhanced processing chamber having one embodiment of a dual frequency matching circuit.

FIG. 5 depicts a partial schematic, cross-section view of a capacitively coupled, plasma enhanced processing chamber 500 suitable for use with the present invention. In one embodiment, a process chamber 500 includes a grounded chamber body 502 and at least one coil segment 518 disposed proximate to the exterior of the chamber body 502. The process chamber 500 also includes a wafer support pedestal 516 disposed within the chamber body 502 and spaced apart from a gas inlet 532. The wafer support pedestal 516 comprises a cathode 527 and an electrostatic chuck 526 for retaining a substrate 514 beneath the gas inlet 532.

The electrostatic chuck 526 is driven by a DC power supply 520 to develop an electrostatic force that holds the substrate on the chuck surface. The cathode 527 is coupled to a pair of RF bias sources 104, 106 through a dual frequency, variable shunt matching circuit 108. The bias sources 104, 106 are generally capable of producing an RF signal having a frequency of from about 50 kHz to about 14.2 MHz and a power of between about 0 and about 5000 Watts. The dual frequency, variable shunt matching circuit 108 matches the impedance of the sources 104, 106 to the plasma impedance. A single feed 114 couples energy from both sources to the support pedestal 516.

The gas inlet 532 may comprise one or more nozzles or a showerhead. The gas inlet 532 may comprise a plurality of gas distribution zones such that various gases—which, when ignited, form a plasma 510—can be supplied to the chamber body 502 using a specific gas distribution gradient. The gas inlet 532 may form an upper electrode 528 that opposes the support pedestal 516.

In operation, a substrate 514 is disposed in the processing chamber 500 and held to the support pedestal 516 by the electrostatic chuck 526. A process gas is introduced into the chamber body 502 through the gas inlet 532 by the gas source 508. A vacuum pump, not shown, maintains the pressure inside the chamber body 502 at operating pressures—typically between about 10 mTorr to about 20 Torr.

The RF source 104 provides about 5000 W of RF voltage at 13.56 MHz to the cathode 527 through the dual frequency, variable shunt matching circuit 108, thereby exciting the gas inside the chamber body 502 and forming a plasma 510. The RF source 106 provides about 5000 W of RF voltage at a frequency of about 2 MHz to the cathode 527 through the dual frequency, variable shunt matching circuit 108. The RF source 106 provides bias power that both self-biases the substrate and modulates the plasma sheath. After a period of time, or the detection of a specific endpoint, the plasma is extinguished.

While the foregoing is directed to the illustrative embodiment of the present invention, other and further embodiments of the invention may be devised without departing from the basic scope thereof, and the scope thereof is determined by the claims that follow.

What is claimed is:

1. Apparatus for matching the impedance of a pair of RF sources coupled to a single electrode to the impedance of a plasma in a semiconductor substrate processing chamber, comprising:

a first sub-circuit for matching the impedance of a first variable frequency RF signal generated by a first RF source to the impedance of the plasma; and a second sub-circuit for matching the impedance of a second variable frequency RF signal generated by a second RF source to the impedance of the plasma, the second sub-circuit connected to the first sub-circuit to form a common output that is coupled to the electrode;

wherein the first and second sub-circuits each further comprise at least one fixed set of series components and at least one variable shunt component connected to ground, and wherein a first match tune space defined by the first sub-circuit can be varied without affecting a second match tune space defined by the second sub-circuit.

2. The apparatus of claim 1, wherein a match tune space of the first and second RF sources is controllable by the shunt components.

3. The apparatus of claim 1, wherein a match tune space of the first and second RF sources is controllable by varying at least one of a first and a second frequency of a signal respectively generated by the first and second RF sources.

4. The apparatus of claim 1, wherein the first and second RF sources each have a 50 Ohm output impedance.

5. The apparatus of claim 1, wherein the first and second sub-circuits are fixed in a predetermined configuration prior to performing a particular process in the processing chamber.

6. The apparatus of claim 1, wherein the impedance of the first and second RF sources may be matched to the impedance of the processing chamber during processing by at least one of:
  varying at least one value of a component of the first and second sub-circuits during operation of the processing chamber; or
  varying the frequency of at least one of the first and the second RF sources.

7. The apparatus of claim 1, further comprising:
  an isolation sub-circuit for preventing power supplied from either of the first and second RF sources from being coupled to the other of the first and second RF sources.

8. The apparatus of claim 1, wherein the first sub-circuit and the second sub-circuit are both configured to match the impedance of an RF signal having a frequency of between about 50 KHz and about 14.2 MHz.

9. Apparatus for matching the impedance of a pair of RF sources coupled to a single electrode to the impedance of a plasma in a semiconductor substrate processing chamber, comprising:
  a first sub-circuit for coupling to a first variable frequency RF source and having a first set of fixed series components and a first variable shunt to ground; and
  a second sub-circuit for coupling to a second variable frequency RF source and having a second set of fixed series components and a second variable shunt to ground, the second sub-circuit connected to the first sub-circuit to form a common output that is coupled to the electrode;
  wherein a first match tune space defined by the first sub-circuit can be varied without affecting a second match tune space defined by the second sub-circuit.

10. Apparatus for matching the impedance of a pair of RF sources coupled to a single electrode to the impedance of a plasma in a semiconductor substrate processing chamber, comprising:
  a processing chamber comprising at least a first electrode;
  a first variable frequency RF source;
  a second variable frequency RF source; and a dual frequency matching circuit, comprising:
    a first sub-circuit coupled to the first RF source; and
    a second sub-circuit coupled to the second RF source and connected to the first sub-circuit to form a common output that is coupled to the first electrode;
    wherein the first and second sub-circuits each further comprise at least one fixed set of series components and at least one variable shunt component connected to ground, and wherein a first match tune space defined by the first sub-circuit can be varied without affecting a second match tune space defined by the second sub-circuit.

11. The apparatus of claim 10, wherein a match tune space of the first and second RF sources is controllable by the shunt components.

12. The apparatus of claim 10, wherein a match tune space of the first and second RF sources is controllable by varying at least one of a first and a second frequency of a signal respectively generated by the first and second RF sources.

13. The apparatus of claim 10, wherein the first and second sub-circuits are fixed in a predetermined configuration prior to performing a particular process in the processing chamber.

14. The apparatus of claim 10, wherein the impedance of the first and second RF sources may be matched to the impedance of the processing chamber during processing by at least one of:
  varying at least one value of a component of the first and second sub-circuits during operation of the processing chamber; or
  varying the frequency of at least one of the first and the second RF sources.

15. The apparatus of claim 10, wherein the dual frequency matching circuit further comprises:
  an isolation sub-circuit for preventing power supplied from either of the first and second RF sources from being coupled to the other of the first and second RF sources.

16. The apparatus of claim 10, wherein the first RF source and the second RF source are both configured to provide an RF signal having a frequency of between about 50 KHz and about 14.2 MHz.

17. Apparatus for matching the impedance of a pair of RF sources coupled to a single electrode to the impedance of a plasma in a semiconductor substrate processing chamber, comprising:
  a first sub-circuit for matching the impedance of a first RF signal having a variable frequency of between about 50 KHz and about 14.2 MHz generated by a first RF source to the impedance of the plasma; and
  a second sub-circuit for matching the impedance of a second RF signal having a variable frequency of between about 50 KHz and about 14.2 MHz generated by a second RF source to the impedance of the plasma, the second sub-circuit connected to the first sub-circuit to form a common output that is coupled to the electrode, and wherein a first match tune space defined by the first sub-circuit can be varied without affecting a second match tune space defined by the second sub-circuit.

18. The apparatus of claim 17, wherein the first and second sub-circuits each further comprise:
  at least one fixed set of series components; and
  at least one variable shunt component connected to ground.

19. Apparatus for matching the impedance of a pair of RF sources coupled to a single electrode to the impedance of a plasma in a semiconductor substrate processing chamber, comprising:

a first sub-circuit for matching the impedance of a first RF signal generated by a first RF source to the impedance of the plasma; and a second sub-circuit for matching the impedance of a second RF signal generated by a second RF source to the impedance of the plasma, the second sub-circuit connected to the first sub-circuit to form a common output that is coupled to the electrode;

wherein the first and second sub-circuits are each adapted to vary a respective match tune space defined by the respective sub-circuit without affecting another respective match tune space defined by the other sub-circuit.

* * * * *